United States Patent [19] [11] 3,911,370
Pace [45] Oct. 7, 1975

[54] AUDIO FREQUENCY AMPLITUDE COMPENSATOR

[76] Inventor: Jerry B. Pace, 2206 John St., Pasadena, Tex. 77502

[22] Filed: July 22, 1970

[21] Appl. No.: 57,293

[52] U.S. Cl. .............................. 330/21; 330/124 R
[51] Int. Cl.[2] .............................. H03F 3/04
[58] Field of Search .............................. 330/21, 154; 179/171 (3 A), 171 (3 B)

[56] References Cited

UNITED STATES PATENTS 2,710,314 6/1955 Tongue et al. .................. 330/154 X

OTHER PUBLICATIONS

Radio–Electronics–Audio–High Fidelity, Feb. 1955 pp. 86–89, "4–Input Amplifier," by Albert Stratmoen.
Radio–Electronics–Audio, Vol. 23, Issue 3, Dec. 1951, pp. 27, 28 "Three–Channel Amplifier," by J. Zoucas.
Radio–Electronics, Sept. 1950, p. 76 (Radio–Electronic Circuits) "Tone Control Circuit," by James Charles Soukupi.

*Primary Examiner*—Nathan Kaufman
*Attorney, Agent, or Firm*—Hubbard, Thurman, Turner & Tucker

[57] ABSTRACT

An audio frequency amplitude compensator is disclosed including in a first section for independently boosting the amplitude of signals in the bass audio range and in the treble audio range, and a second section connected in series with the first section for independently providing a second boost in the amplitude of signals in the bass audio frequency range and a second boost in the amplitude of signals in the treble audio frequency range. The first section has a relatively narrow band bass frequency response and a relatively narrow band treble frequency response, and the second section has a relatively broad bass frequency response and a relatively broad band treble frequency response.

8 Claims, 4 Drawing Figures

BASIC VARIABLE Q BANDPASS FILTER

JERRY B. PACE
INVENTOR.

BY Dyer, Eickenroht, Thompson & Turner
ATTORNEYS

JERRY B. PACE
INVENTOR.

BY Hyer, Eickenroht, Thompson & Turner
ATTORNEYS

AUDIO FREQUENCY AMPLITUDE COMPENSATOR

This invention relates to sound reproduction systems and in one of its aspects to such a system in which audio signals in the bass and treble audio frequency ranges are boosted in amplitude with respect to audio frequency signals in the mid-ranges.

In sound reproduction, particularly where a broad range of frequencies is involved, it is difficult to obtain a truly flat response over the range of frequencies employed. In the general range of audio frequencies involved in reproducing sound in the audio range, such as in hi-fi and stereo systems, playback to the listener is generally not at the same volume for frequencies in the lower bass range, for example 80 Hz or lower; or in the upper treble range, for example 10 KHz or above. In most systems utilized for reproduction or playback the frequency response is such that the volume of the audio of these frequencies will be substantially less than the volume of the audio in the mid-ranges between these frequencies with the same setting of the volume control of the system.

Also, the human ear does not respond to all frequencies equally so that the relative intensity of sound at low and high frequencies does not change at the same rate as in the mid-range frequencies. Although the volume of the system can be adjusted to compensate for responses of different ears this is not an adequate method of compensating for the inability to respond to sound at the low and high frequencies. Thus, the effect is that when the reproduced sound is at the proper volume in the mid-ranges for satisfactory listening, much of the sound in the bass and treble ranges is reduced so much in volume that it is either not heard, or its level is in no way compatible with the original level at those frequencies when the sound was originally reproduced.

Various systems have been devised in order to boost the volume of reproduced sound at various audio frequencies, particularly in the base and treble range. However, none of these systems have provided a satisfactory boost in the desired ranges without affecting the mid-range frequencies so that the volume during playback closely approximates the original level of the sound. Also, prior circuits have not provided satisfactory means for varying the boost independently at different frequencies of the frequency spectrum to compensate for varying conditions of reproduction on playback.

It is thus an object of this invention to provide an audio frequency amplitude compensator providing a boost in the amplitude of audio frequency signals in the bass and treble ranges while having minimal effect on the amplitude of signals in the mid-ranges.

It is another object of this invention to provide such an compensator which provides a more accurate playback to the listener of the original sound than previously devised audio systems.

It is another object of this invention to provide such a compensator in which the boost in amplitude in the bass and treble ranges may be independently adjusted and in which amplitude boost at different parts of these ranges may be selected.

It is another object of this invention to provide such a compensator in which low level audio signals in the bass and treble range which would normally be lost in reproduction and playback may be played back to the listener at an adequate and comfortable level.

It is another object of this invention to provide such a compensator which is relatively inexpensive and simple to construct and which utilizes standard and easily obtainable components.

Occasionally it is desirable to cut down or attenuate the volume at certain unwanted audio frequencies without disturbing the relative volume at other audio frequencies. For example, certain listeners may find the strong bass boost generally employed in the making of rock records to be objectionable and desire to reduce the playback volume of the bass relative to the other audio frequencies. It is thus another object of this invention to provide an audio frequency amplitude compensator having added flexibility so that certain unwanted frequencies which are normally boosted in the system can be attenuated with minimal affect on the other audio frequencies being played back.

These and other objects and advantages of this invention are accomplished in accordance with this invention by providing an audio frequency amplitude compensator having a first bass audio frequency boost circuit to provide a first increase of the amplitude of audio signals in the bass frequency range, and a second bass audio frequency boost circuit connected to the output of said first circuit to provide a second increase in the amplitude of audio signals in the bass frequency range. The audio frequency amplitude compensator may also include a first treble audio frequency boost circuit to provide a first increase of the amplitude of audio signals in the treble frequency range, and a second treble audio frequency boost circuit connected to the output of said first treble boost circuit to provide a second increase in the amplitude of audio signals in the treble frequency range. Means is also provided for mixing the boosted bass and treble range signals with mid-range signals to provide a composite output signal having the desired boost in the bass and treble audio frequency ranges, but having little or no boost in amplitude of the mid-range audio frequency signals.

It is preferred that each of the first bass and first treble boost circuits have a relatively narrow band pass in the bass and treble ranges respectively, and that each of the second bass and second treble boost circuits have a relatively broad band pass and respectively include within their band widths the frequencies of said first boost circuits.

A further novel aspect of this invention is the provision of means for adjusting the gain of each of the boost circuits independently of each other so that an adjustment is provided of the amplitude of each of the bass and treble boost circuits. Each of the first bass and treble boost circuits is preferably a variable Q bandpass filter employing an operational amplifier having a feedback loop for adjusting the gain. The Q of the bandpass filter is adjusted by adjusting the gain of the operational amplifier.

In the drawings, wherein is illustrated a preferred embodiment of the invention:

The audio frequency range is generally considered to be that range of sound wave frequencies to which the human ear can perceive sound, and can be from as low as 10 Hz to as high as 40 KHz. In this range of frequencies the lower portion is generally referred to as the bass frequency range and is considered to be below 300 Hz and generally in the range of 10 Hz to 80 Hz. The upper range of these frequencies is generally referred to as the treble frequency range and is considered to be above 2 KHz and generally in the range of 10 KHz to 40 KHz. The remaining frequencies of the audio frequency range are considered the mid-range and they may overlap somewhat with the upper range of bass range frequencies and the lower range of treble range frequencies. What range of frequencies within the broad ranges given which are considered to be the bass or treble frequencies for a particular application depends somewhat on the type of sound being reproduced, the frequency response of the reproduction and playback equipment used, and the ability of the listener to hear the sound when played back. Thus, for purposes of describing this invention the term "bass audio frequency range" is employed to designate a specific range of audio signals in the broad range of bass audio frequencies which are to be boosted in amplitude with respect to signals in the mid-range of audio frequencies. Likewise, the term "treble audio frequency range" is employed to designate a specific range of audio signals in the broad range of treble audio frequencies which are to be boosted in amplitude with respect to signals in the mid-range of audio frequencies. The specific range of bass and treble audio frequencies to be boosted in amplitude with respect to the mid-range frequencies will depend on the requirements of the specific application.

Figures 1, 2:
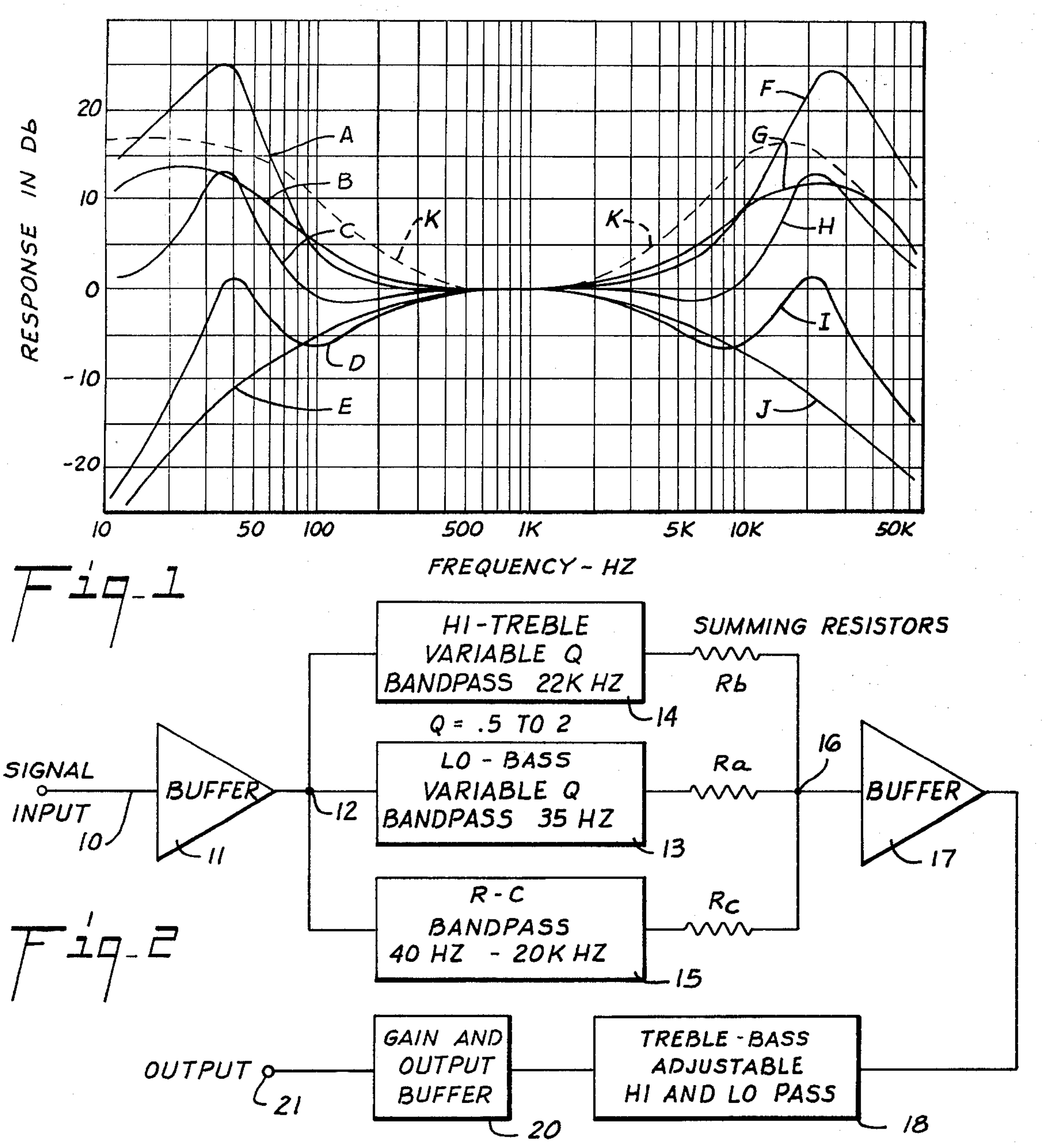
FIG. 1 is a graph showing the frequency response of the various circuits employed in this invention.
FIG. 2 is an overall block diagram of the preferred form of amplitude compensator of this invention.

In FIG. 1 a number of curves are shown illustrating the frequency response of various bass and treble amplitude boost circuits including the amplitude compensator of this invention. In each of the curves shown a reference point is illustrated in the mid-range of frequencies and at about 800 Hz, and all the curves illustrate either a boost or attenuation of audio signals at frequencies above and below this frequency. Curve K illustrates the typical bass and treble boost obtained in prior audio playback systems using standard bass and treble tone controls. The rate of boost in such systems is normally very slow, generally around 3 db per octave, and rises to a maximum boost of approximately 18 db at 40 Hz and 20 KHz. However, because of the slow rise of the boost curve K, signals in the range of approximately 100 Hz to 5 KHz can have a boost in amplitude of as much as 10 db. Since most of the signal loss in either recording or playback lies outside of this area (i.e. below 100 Hz and above 5 KHz) poor and unnatural reproduction of sound generally results from bass and treble boost of the type illustrated by curve K.

The present invention affects a substantial improvement over prior bass and treble boost circuits by providing for a bass boost beginning at a much lower frequency and a treble boost beginning at a much higher frequency. The amplitude boost provided in the low bass range and the high treble range is of a substantially greater magnitude than that provided at other frequency ranges so that the amplitude of audio signals in the mid-range is not affected appreciably. In this way a more natural play back of the reproduced sound occurs.

The bass and treble boost which may be provided by the preferred embodiment of this invention is illustrated by curve A-F in FIG. 1. Curve A illustrates a boost of about 25 db at 35 Hz, in the bass range, and curve F illustrates a boost of about 25 db at 22 KHz, in the treble range. However, in the mid-range from as low as 100 Hz to as high as 5 KHz the gain is no more than about 3 db, and over a large part of that range is substantially less. Thus, the boost in the bass and treble audio frequency ranges exemplified by curve A-F has only minimal effect on the amplitude of the mid-range frequencies. Curves B-G and C-H are also illustrative of bass and treble amplitude boost provided by this invention as will be explained in detail.

Figure 3:
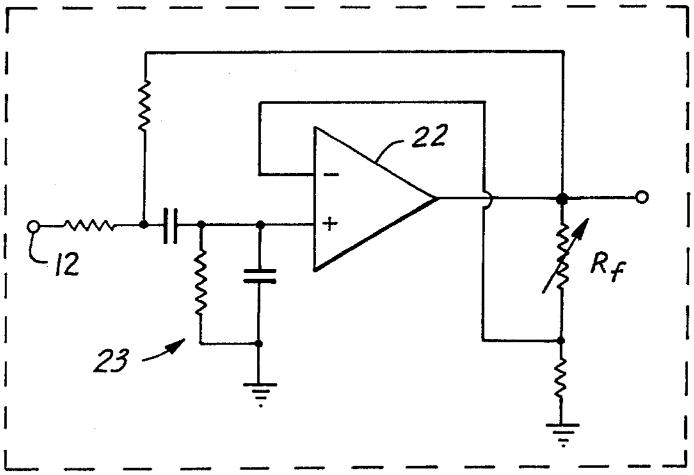
FIG. 3 is a schematic diagram of a preferred form of the variable Q band pass filter which utilizes an operational amplifier.
Figure 4:
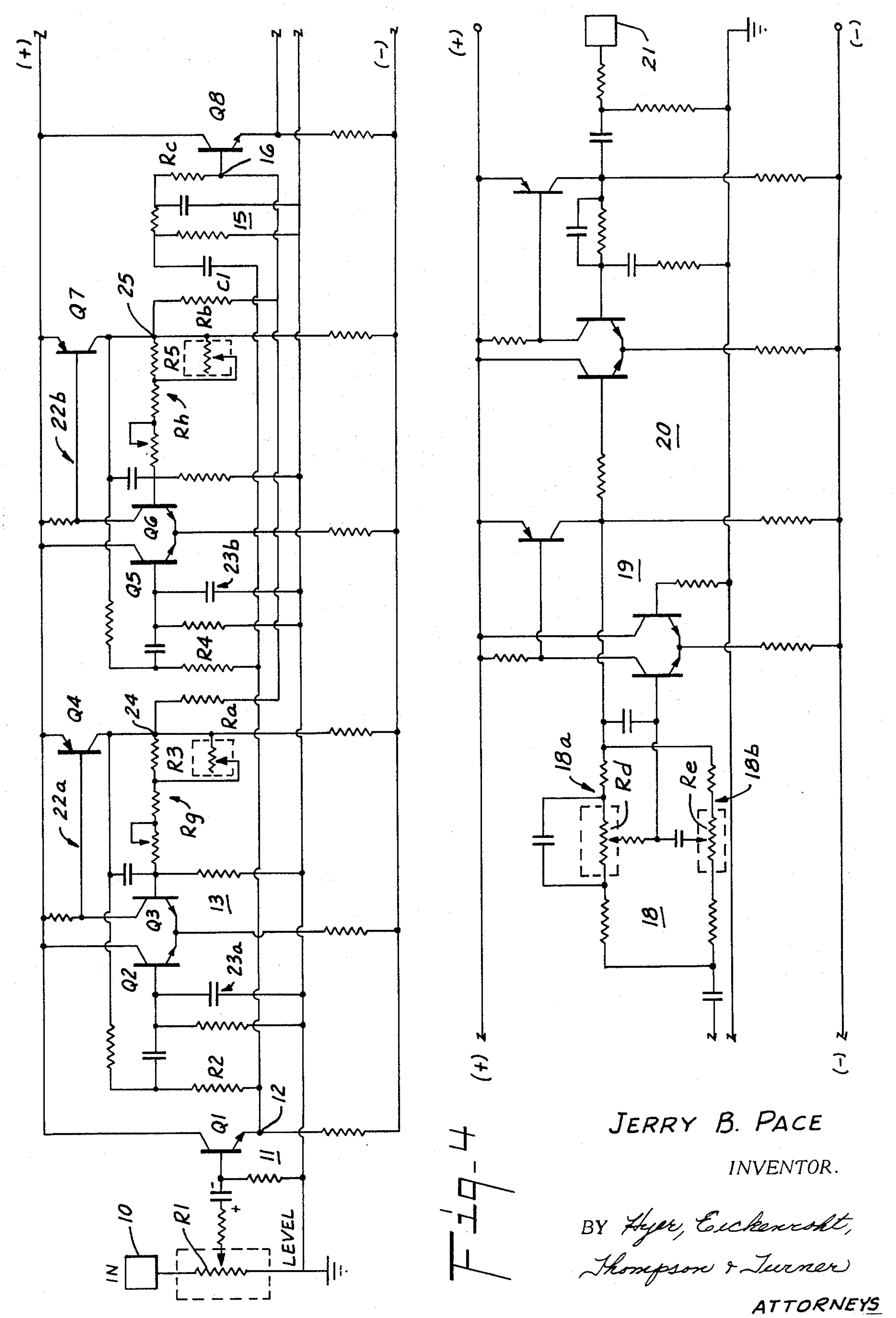
FIG. 4 is a detailed schematic diagram of the preferred embodiment of the amplitude compensator of this invention.

The circuits for providing the bass and treble boost illustrated by curve A-F are shown in FIGS. 2, 3 and 4. Input signals in the audio frequency range are received at an input 10 and passed through a volume or level control $R_1$ to a buffer stage 11. Buffer 11 is illustrated in FIG. 4 as an emitter-follower including transistor $Q_1$ and associated components. Buffer 11 serves to match the impedance at input 10 which is generally high to the lower impedance of the stage that follows. The emitter of transistor $Q_1$ is connected to a point 12 which serves as an input to the various filter circuits to be described. Connected at its input to point 12 and the output of buffer 11 is a first bass audio frequency boost circuit 13, illustrated as a variable Q band pass filter tuned to approximately 35 Hz. Also connected to point 12 is a first treble audio frequency boost circuit 14, illustrated as a variable Q band pass filter tuned to approximately 22 KHz, and a mid-range band pass circuit 15, illustrated as a band pass filter tuned to pass audio signals from 40 Hz 20 KHz.

Thus, the audio signals received at point 12 are divided so that only bass range signals pass through circuit 13, only the treble range signals pass through circuit 14, and the signals in between and in the mid-range pass through filter 15. However, signals passing through circuits 13 and 14 are boosted in amplitude, while the signals passing through circuit 15 are not. Curve C illustrates the relative amplitude with respect to the amplitude at 800 Hz of signals coming from circuit 13, and curve H illustrates the relative amplitude with respect to the amplitude at 800 Hz of signals coming from circuit 14. The output of these circuits and circuit 15 are connected through summing resistors Ra, Rb, and Rc respectively, to point 16 which is the input to a second buffer 17. Buffer 17 is also an emitter-follower including transistor $Q_8$ and its associated components. The emitter of $Q_8$ is connected to a filter circuit 18 including a second bass audio frequency boost circuit 18*a*, and a second treble audio frequency boost circuit 18*b*. Filter 18*a* includes a bass boost adjustment potentiometer Rd and filter 18*b* includes a treble boost adjustment potentiometer Re. Filter circuit 18 also includes an amplifier 19 connected at its input to filters 18*a* and 18*b*, and amplifier 19 is in turn connected to an amplifier-buffer 20. The circuits 18*a* and 18*b* are similar to conventional bass and treble tone control circuits and, as illustrated by curves B and G, provide a relatively broader band amplitude boost than circuits 13 and 14. Curve B illustrates the boost in amplitude obtained through filter 18*a* in the bass range audio frequencies after suitable amplification, and curve G illustrates the boost in amplitude obtained through filter 18*b* in the treble range audio frequencies after suitable amplification.

Amplifier-buffer 20 acts as an impedance match to the output and also serves to provide approximately unity gain for the compensator circuit from input 10 to the output of amplifier 20 at point 21. Curve A-F is thus a composite curve which illustrates the relative amplitudes at output 21 of the bass, mid-range, and treble range qudio frequencies after the input audio signals have passed through the various filter circuits 13, 14, 15 and 18. As illustrated in FIG. 1 by curve A-F, the amplitude compensator of this invention has a relatively fast rise and fall time in the bass and treble ranges, and it has substantially flat response in the mid-ranges, when compared to prior tone control circuits represented by curve K.

As noted bass boost circuit 13 and treble boost circuit 14 are variable Q bandpass filters. A preferred circuit of such a filter is shown in FIG. 3 and includes an operational amplifier 22 having a feedback loop which controls the gain of the amplifier and the relative Q of the circuit. The operational amplifier has two inputs, one (indicated as positive) connected to an R-C filter 23 tuned to the passband of the frequencies to be boosted, and a second input (indicated as negative) connected to the output of amplifier 27 through a variable resistor Rf. Amplifier 22 has the characteristic that the output voltage is proportional to the difference of the voltages applied to the input terminals. Thus, the greater the signal which passes through filter 23, the greater the output and gain in the amplifier. The gain of amplifier 22 may be adjusted by varying Rf to vary the voltage differential between the input terminals. It is also a characteristic of the circuit shown in FIG. 3 that when Rf is varied to vary the gain of amplifier 22, the Q of the filter network 23 is also varied. In the circuits used in the preferred embodiment of this invention, and described herein, the Q has been varied from a low value of 0.5 to high value of 2.

Curves C and H represent the bandpass characteristics of the FIG. 3 circuitry when employed as bass and treble variable Q bandpass filters, respectively. The bandpass characteristics of the input filter network 23 employed determine the pass band of the circuit.

FIG. 4 shows the detail schematic of the preferred embodiment of this invention. Audio frequency signals at point 12 are conducted through a resistor $R_2$ to a bass frequency bandpass filter network 23a comprising the input to the bass frequency variable Q bandpass circuit 13. Transistors $Q_2$, $Q_3$ and $Q_4$ in circuit 13 form an operational amplifier 22a with the base of $Q_2$ connected to filter network 23*a* to form one input, and the base of $Q_3$ forming the second input. The base of $Q_3$ is connected to a feedback loop including a voltage divider network Rg connected between the output of amplifier 22*a* at point 24 (the collector of $Q_4$) and the base of $Q_3$. This voltage divider network includes a variable resistor $R_3$ which permits adjustment of the amount of bass boost obtained from circuit 14. Point 24 is connected through a summing resistor Ra to point 16. Thus, bass range audio signals are conducted to amplifier 22*a* where they are boosted and the boosted base signals are present at point 16.

Filter network 23*a* is tuned to approximately 35 Hz and thus passes the low frequency bass signals exemplified by curve C in FIG. 1 to circuit 13.

Point 12 is also connected through a resistor $R_4$ to a treble frequency bandpass filter network 23*b* comprising the input to the treble frequency variable Q bandpass circuit 14. Transistors $Q_5$, $Q_6$, and $Q_7$ in circuit 14 form an operational amplifier 22*b* identical to amplifier 22*a* except that the values of certain components are changed to permit operation at the higher treble frequencies. Filter network 23*b* is tuned to approximately 22 KHz and thus passes the high frequency treble frequency signals exemplified by curve H in FIG. 1 to circuit 14 where they are boosted in amplitude. The feedback loop to amplifier 22*b* includes a voltage divider network Rh connected between the base of $Q_6$ and the collector of $Q_7$. The network Rh includes a variable resistor $R_5$ which permits adjustment of the amount of treble boost obtained from circuit 14. The output of circuit 14 at point 25 is connected to point 16 through summing resistor Rb.

Mid-range audio frequency signals received at point 12 are conducted through a capacitor C, to mid-range bandpass filter 15 which pass from this filter through resistor Rc to point 16. The composite signal having the boosted bass and treble is thus obtained at point 16, at the base of emitter-follower $Q_8$, and is then conducted through $Q_8$, and from the emitter thereof, through a capacitor $C_2$ to second bass filter network 18*a* and second treble bass network 18*b*, the operation of which has been previously described.

Curves D-I and E-J in FIG. 1 represent situations where one or more of the bass or treble boost circuits have been cut off resulting in an attenuation of signals in these ranges. If it is desired to reduce the gain in the playback system in the bass range, then one or both of the bass boost circuits can be cut by reducing their gain to zero. For example, by cutting the bass gain of bass filter circuit 18*a* off the bass frequency signals received at the input of circuit 18 are greatly attenuated in circuit 18*a*, or must pass through circuit 18*b* where the frequency response is much higher. The resultant amplitude in the bass range is shown in curve D. The very slight boost in the bass in curve D is provided by bass boost circuit 13. However, if the gain of bass boost circuit 13 is also cut off at the same time that circuit 18*a* is cut off, so that bass audio frequency signals received at 12 must pass through either treble circuit 14 or the mid-range bandpass filter 15, then the relative amplitude of the bass audio frequency signals is represented by curve E. In curve E no boost is present at all in the bass range signals.

If it is desired to cut or attenuate treble range audio frequency signals, then one or both of the treble bandpass circuits 14 or 18*b* can be cut by reducing their gain control to zero. Curve I represents the relative amplitude of treble range signals with bandpass circuit 18*b* cut, and curve J represents the relative amplitude of treble range signals with bandpass circuit 18*b* and boost circuit 14 cut.

Thus, it can be seen that the relative amplitude of the bass, treble, and mid-range audio frequency signals can be easily adjusted in the compensator circuit of this invention between the extremes represented by the curves E-J and A-F. The compensator of this invention is well adapted for use in many different audio systems to provide desired variations in the amplitude of the bass and treble audio frequency signals with little or no effect on the amplitude of the mid-range audio signals.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed with reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

What is claimed is:

1. An audio frequency amplitude compensator responding to audio frequency signals including such signals in the mid-range audio frequency range and in the bass and treble audio frequency ranges to provide an increase in the amplitude of said bass and treble range signals in relation to the amplitude of mid-range audio frequency signals, comprising in combination: an input for receipt of said audio frequency signals; an output; a first bass audio frequency boost circuit including a variable Q band pass filter having a relatively narrow band pass frequency response in the bass audio frequency range, and connected to said input and providing for a first increase in the amplitude of said bass audio frequency signals, a first treble audio frequency boost circuit including a variable Q band pass filter having a relatively narrow band pass frequency response in the treble audio frequency range and connected to said input to provide a first increase in the amplitude of said treble audio frequency signals; a second bass audio frequency boost circuit connected between said first bass audio frequency boost circuit and said output and providing for a second increase in the amplitude of said bass audio frequency signals, said second bass audio frequency boost circuit having a relatively broad band pass frequency response and including within its band widths the band width of said first bass audio frequency boost circuit; and a second treble audio frequency boost circuit connected between said first treble audio frequency boost circuit and said output and providing for a second increase in the amplitude of said treble audio frequency signals, said second treble audio frequency boost circuit having a relatively broad band treble frequency response and including within its band width the band width of said first treble audio frequency boost circuit, the composite band pass of said first and second bass and treble boost circuits being such that said audio frequency signals in the bass and treble audio frequency ranges can be boosted substantially in amplitude while audio frequency signals in the mid-range audio frequencies are not appreciably boosted in amplitude.

2. The compensator of claim 1 including means for adjusting the gain of at least one of said first and second circuits.

3. The compensator of claim 1 wherein each of said variable Q band pass filters is an operational feedback amplifier having a variable Q control means connected between the output and an input of said operating amplifier.

4. An audio frequency compensator for increasing the amplitude of bass and treble range audio signals with respect to the amplitude of mid-range audio signals, comprising in combination: an input; a first bass audio frequency boost circuit connected to said input and providing for a first increase in the amplitude of signals at said input in the bass audio frequency range; a first treble boost circuit connected to said input and providing for a first increase in the amplitude of signals at said input in the treble audio frequency range; mixing means connected to the outputs of each of said first circuits for providing a first composite signal including said boosted bass and treble audio frequency signals; a second bass audio frequency boost connected to said mixing means for receipt of said composite signal to provide for a further increase in the amplitude in the bass audio frequency range thereof; a second treble audio frequency boost circuit connected to said mixing means for receipt of said composite signal to provide for a further increase in the amplitude in the treble audio frequency range thereof, one of each of said bass boost circuits and one of each of said treble boost circuits having a relatively broad band pass, and the other of said bass boost circuits having a relatively narrow band pass within the band pass of said one bass boost circuit, and the other of said treble boost circuits having a relatively narrow band pass within the band pass of said one treble boost circuit, and means connected to the outputs of said second circuits to provide a second composite signal having increased amplitudes in the bass and treble ranges with respect to the amplitude of bass and treble range signals at said input.

5. The compensator of claim 4 further including a bandpass filter for passing audio frequency signals between said bass and treble ranges, said band pass filter connected between said input and said mixing means.

6. The compensator of claim 4 wherein each of said first bass and treble boost circuits are variable Q bandpass filters.

7. The compensator of claim 4 further including means for adjusting the amplitude gain of each of said first circuits.

8. The compensator of claim 7 further including means for adjusting the amplitude gain of each of said second circuits.

* * * * *